(12) United States Patent
Shen

(10) Patent No.: US 9,842,820 B1
(45) Date of Patent: Dec. 12, 2017

(54) WAFER-LEVEL FAN-OUT WIREBOND PACKAGES

(71) Applicant: Altera Corporation, San Jose, CA (US)

(72) Inventor: Minghao Shen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 28 days.

(21) Appl. No.: 14/960,180

(22) Filed: Dec. 4, 2015

(51) Int. Cl.
*H01L 23/48* (2006.01)
*H01L 23/00* (2006.01)
*H01L 25/065* (2006.01)

(52) U.S. Cl.
CPC .............. *H01L 24/24* (2013.01); *H01L 24/49* (2013.01); *H01L 24/82* (2013.01); *H01L 24/85* (2013.01); *H01L 25/0655* (2013.01); *H01L 2224/2405* (2013.01); *H01L 2224/24137* (2013.01)

(58) Field of Classification Search
CPC ......... H01L 24/24; H01L 24/29; H01L 24/82; H01L 24/85; H01L 2224/24137; H01L 2224/2405
See application file for complete search history.

(56) References Cited

U.S. PATENT DOCUMENTS

| | | | |
|---|---|---|---|
| 6,861,761 B2 | 3/2005 | Yang | |
| 7,218,006 B2 | 5/2007 | Kang et al. | |
| 7,508,059 B2 | 3/2009 | Lin et al. | |
| 7,973,401 B2 | 7/2011 | Lin et al. | |
| 8,193,637 B2 | 6/2012 | Park et al. | |
| 8,426,958 B2 | 4/2013 | Lin et al. | |
| 8,822,268 B1 | 9/2014 | Magnus | |
| 9,129,935 B1 | 9/2015 | Chandrasekar et al. | |
| 2008/0157341 A1* | 7/2008 | Yang ..................... | H01L 23/467 257/700 |
| 2009/0206461 A1* | 8/2009 | Yoon ..................... | H01L 21/565 257/686 |
| 2010/0213588 A1* | 8/2010 | Hsieh ................ | H01L 23/49816 257/676 |
| 2011/0084382 A1* | 4/2011 | Chen ....................... | H01L 24/97 257/737 |
| 2012/0013001 A1* | 1/2012 | Haba ..................... | H01L 21/561 257/737 |

(Continued)

FOREIGN PATENT DOCUMENTS

CN 10-3887279 * 6/2014

OTHER PUBLICATIONS

Machine translated document (CN 10-3887279), Jun. 2014.*

*Primary Examiner* — A. Sefer

(57) ABSTRACT

An integrated circuit package that includes an integrated circuit die, a redistribution substrate, a wirebond interconnect and a package substrate is disclosed. The redistribution substrate is formed on the integrated circuit die and may be wider than the integrated circuit die. The package substrate is formed below the integrated circuit die. The wirebond interconnect may have one of its ends attached to the redistribution substrate and another end attached to the package substrate. In addition to that, another integrated circuit die may be formed between the redistribution substrate and the package substrate. The integrated circuit dies may communicate with each other through the redistribution substrate. In addition to that, a method to manufacture the integrated circuit package may also be disclosed.

17 Claims, 6 Drawing Sheets

(56) References Cited

U.S. PATENT DOCUMENTS

| | | | |
|---|---|---|---|
| 2012/0161279 A1* | 6/2012 | Lin | H01L 21/561 257/531 |
| 2012/0217645 A1* | 8/2012 | Pagaila | H01L 21/486 257/774 |
| 2012/0326302 A1* | 12/2012 | Camacho | H01L 21/4832 257/737 |
| 2013/0026658 A1* | 1/2013 | Chen | H01L 24/05 257/784 |
| 2013/0244376 A1* | 9/2013 | Scanlan | H01L 21/78 438/113 |
| 2014/0001615 A1* | 1/2014 | Otremba | H01L 23/3107 257/676 |
| 2014/0042600 A1* | 2/2014 | Kim | H01L 23/3135 257/666 |
| 2014/0070422 A1* | 3/2014 | Hsiao | H01L 24/24 257/774 |
| 2014/0077364 A1* | 3/2014 | Marimuthu | H01L 23/5389 257/737 |
| 2014/0332908 A1* | 11/2014 | Ho | H01L 21/76877 257/414 |

* cited by examiner

… (1) …

WAFER-LEVEL FAN-OUT WIREBOND PACKAGES

BACKGROUND

A multi-die package includes multiple integrated circuit (IC) dies formed within a single package. The multi-die package may include a fan-out substrate layer to connect the integrated circuit dies to their respective external interconnects. Generally, a fan-out substrate layer is utilized to distribute an interconnection from a small footprint integrated circuit die to an interconnection of a large footprint package substrate.

A multi-die package may use a wafer level fan-out flip-clip technology. The wafer level fan-out flip-chip technology uses controlled collapse chip connection (C4) bumps to couple multiple integrated circuit dies onto a package substrate. However, the wafer level fan-out flip-chip technology may increase a cost for manufacturing when it is used on a large multi-die package. Additionally, military and automotive industry generally does not accept flip-chip technology as this technology may not satisfy their reliability requirements.

Another form of technology that is used to couple the multiple dies to a package substrate is via wirebonding. However, wirebonding generally does not offer sufficient intra-die connection density.

SUMMARY

Embodiments described herein include a wafer level fan-out wirebond package and a method of forming the package. It should be appreciated that the embodiments can be implemented in numerous ways, such as a process, an apparatus, a system, a device, or a method. Several embodiments are described below.

In one embodiment, an integrated circuit package includes an integrated circuit die, a redistribution substrate, a wirebond interconnect and a package substrate. The redistribution substrate is formed on the integrated circuit die and may be larger (or wider) than the integrated circuit die. The package substrate is formed below the integrated circuit die. The wirebond interconnect may have one of its end attached to the redistribution substrate and another end attached to the package substrate. In addition to that, another integrated circuit die may be formed between the redistribution substrate and the package substrate. The integrated circuit dies may communicate with each other through the redistribution substrate.

In another embodiment, a method of forming an integrated circuit package includes a step to forming an integrated circuit die below a routing layer. Furthermore, the method includes a step to attach one end of a wirebond interconnect to a top surface of the routing layer. In addition to that, the method may also include a step to form a package substrate below the integrated circuit die and attach another end of the wirebond to the package substrate.

Further features of the invention, its nature and various advantages will be more apparent from the accompanying drawings and the following detailed description of the preferred embodiments.

DETAILED DESCRIPTION

The following embodiments include a wafer level fan-out wirebond package and a method to form the package. It will be obvious, to one skilled in the art, that the present exemplary embodiments may be practiced without some or all of these specific details. In other instances, well-known operations have not been described in detail in order not to unnecessarily obscure the present embodiments.

Figure 1:
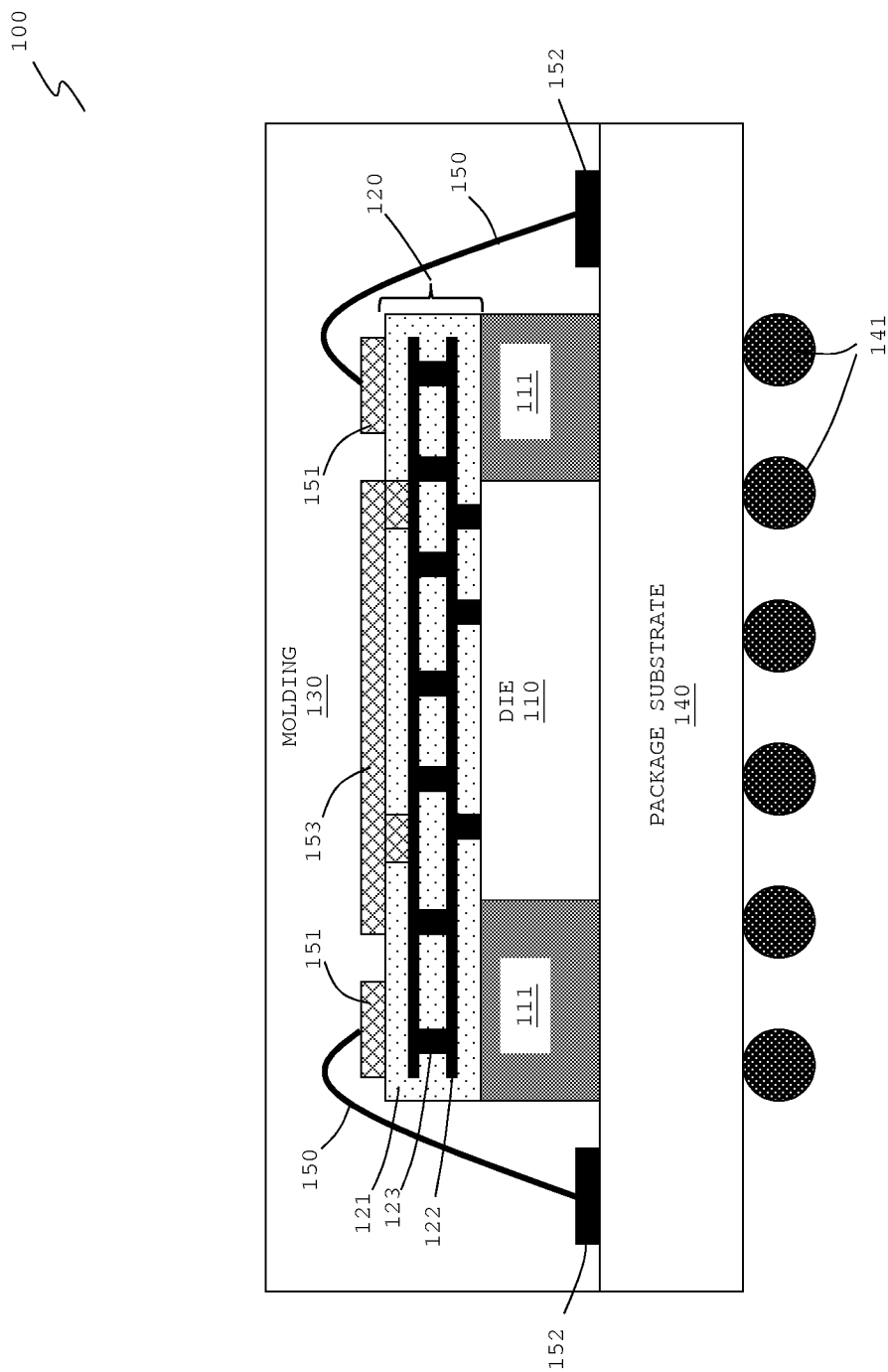
FIG. 1 shows an illustrative integrated circuit package in accordance with one embodiment of the present invention.

FIG. 1, meant to be illustrative and not limiting, illustrates an integrated circuit package in accordance with one embodiment of the present invention. Integrated circuit package 100 may include integrated circuit die 110, routing layer 120, package substrate 140, wirebond interconnects 150 and molding 130.

Integrated circuit package 100 may form a part of a wireless system, a wired system, or other types of systems. Hence, integrated circuit package 100 may include circuits that perform various functions that define the system.

In one embodiment, integrated circuit package 100 may be an application specific integrated circuit (ASIC) device or an application specific standard product (ASSP) device, such as, a memory controller device. The memory controller device may be utilized for controlling data transfer between a memory device and other devices, for example, a microprocessor device. In order to support the data transfer, integrated circuit package 100 may include circuits that handles different protocol standards.

Alternatively, integrated circuit package 100 may be a programmable logic device (PLD), for example, a field programmable gate array (FPGA) device. It should be noted that a PLD may be configured to implement different user designs or applications. In one exemplary embodiment, the PLD may be configured as a memory controller. In another exemplary embodiment, the PLD may be configured as an arithmetic logic unit (ALU).

Integrated circuit package 100 may be placed on a printed circuit board (PCB) (not shown). Each solder ball 141 on integrated circuit package 100 may be coupled to a solder pad on the PCB (not shown). In one embodiment, integrated circuit package 100 may transmit signals (e.g., input/output (I/O) signals) to a device mounted on the PCB through signal pathways that are coupled to solder balls 141.

Referring still to FIG. 1, integrated circuit package 100 includes integrated circuit die 110. Integrated circuit die 110 may be placed on a top surface of package substrate 140. The integrated circuit die 110 may be coupled to package substrate 140 through a die attach film. Integrated circuit die 110 may perform core functions of integrated circuit package 100. In one embodiment, integrated circuit die 110 may include active circuits (e.g., transistor circuits). The active circuits within integrated circuit die 110 may include memory elements, programmable logic elements or arithmetic logic units that perform a variety of functions.

In addition to that, integrated circuit die 110 may include I/O circuits. The I/O circuits may be utilized to transmit signals into or out of integrated circuit die 110. Each of the I/O circuit may be coupled to its corresponding I/O terminal. Generally, the I/O terminals are located on a top surface (relative to the FIG. 1) of integrated circuit die 110. In one embodiment, integrated circuit die 110 may include more than 300 I/O terminals. A pitch distance between two adjacent I/O terminals may be less than 0.5 millimeter (mm).

Referring still to FIG. 1, integrated circuit die 110 may be surrounded by dielectric 111. In one embodiment, dielectric 111 may include wafer level dielectric materials (e.g., organic dielectric, epoxy or resin materials). Dielectric 111 may be utilized to support routing layer 120 that is formed directly above integrated circuit die 110. In addition to that, dielectric 111 may be utilized to fill the gaps that may exist when routing layer 120 is placed above integrated circuit die 110. Integrated circuit die 110 may, in general, separately include a dielectric stack (sometimes referred to as an interconnect stack) formed on a semiconductor substrate. The dielectric stack within die 110 (which may also include alternating metal routing layers and via layers) is a separate structure than routing layer 120, and the dielectric stack within die 110 and routing layer 120 are formed at different times.

As shown in the embodiment of FIG. 1, routing layer 120 is formed directly above integrated circuit die 110 and dielectric 111. In one embodiment, routing layer 120 may be a fan-out redistribution layer (RDL). The routing layer 120 may also be known as a redistribution substrate, in one embodiment. In addition to that, the routing layer 120 may also be known as a die-attachment layer. Generally, a fan-out RDL is utilized as an intermediary layer to couple tight-pitch distance I/O terminals of an integrated circuit die to loose-pitch distance I/O terminals of a package substrate. Routing layer 120 may be coupled to integrated circuit die 110 and dielectric 111 through a die attachment process, in one embodiment. In the embodiment of FIG. 1, routing layer 120 (as a fan-out RDL) may be utilized to fan-out signal pathways from I/O terminals of integrated circuit die 110 to peripheral edges of routing layer 120. Therefore, an I/O signal transmitted from an I/O terminal of integrated circuit die 110 may be routed to the edges of routing layer 120 when the signal reaches the top surface of routing layer 120. In addition to that, routing layer 120 may also be utilized to fan-out signal pathways from various other terminals (e.g. clock terminal, power terminal and etc.) of integrated circuit die 110 to peripheral edges of routing layer 120.

Referring still to FIG. 1, routing layer 120 may include conductive traces 122 and conductive vias 123 formed in dielectric material 121. Dielectric 121 may be a thin-film dielectric. In one exemplary embodiment, dielectric 121 may be formed using materials such as polyimide (PI), polybenzoxazoles (PBO), and benzocyclobuten (BCB). Conductive traces 122 and conductive vias 123 within routing layer 120 serve as signal pathways that may be utilized to fan-out the I/O signals received from integrated circuit die 110. In one embodiment, conductive traces 122 and conductive vias 123 may be formed using metal (e.g., copper or aluminum). Conductive traces 122 may route I/O signals horizontally through each layer of routing layer 120 whereas conductive vias 123 may route I/O signals vertically through the layers forming routing layer 120. As shown in the embodiment of FIG. 1, there are at least two horizontally laid conductive layers (e.g., redistribution layer 120 may include at least two layers of conductive routing traces 122). It should be appreciated that in a complex integrated circuit package 100 may generally (although not necessarily) have more than two horizontally laid conductive layers.

The width of routing layer 120 may be the total width of integrated circuit die 110 and dielectric 111. Similarly, the length of routing layer 120 may be the total length of integrated circuit die 110 and dielectric 111. In one embodiment, the length and width of routing layer 120 may be 10 mm, each, whereas the width and length of integrated circuit die 110 may be approximately 8 mm, each and the width and length of dielectric 111 may be approximately, 2 mm each.

Multiple wirebond pads 151 and conductive traces 153 may be formed on the upper surface of routing layer 120. In one embodiment, conductive traces 153 may be utilized to route I/O signals from conductive traces 122 to wirebond pads 151. Wirebond pads 151 may be located near the edges routing layer 120. In one embodiment, there may be more than 300 wirebond pads 151. Pitch distances between two adjacent wirebond pads 151 may be less than 0.045 mm, in one embodiment. However, a person skilled in the art will recognize applicability of other pitch distances depending on the application and process technologies.

In one embodiment, wirebond pads 151 may be aluminum wirebond pads. Alternatively, wirebond pads 151 may be copper wirebond pads with an aluminum cap. It should be appreciated that an aluminum wirebond pad may be preferred because a bond with an aluminum wirebond interconnect (e.g., wirebond interconnect 150) may not be subject to interface corrosion (i.e., between wirebond interconnect and wirebond pad), intermetallic formation, or other bond degrading conditions.

In one embodiment, each wirebond pad 151 may be coupled to one end of wirebond interconnects 150. Therefore, there may be more than 300 wirebond interconnects 150 (for the reason that there may be more than 300 wirebond pads 151). However, a person skilled in the art appreciates that there may be also be an arrangement in which one wirebond pad 151 may have multiple wirebond interconnects 150. In one embodiment, wirebond interconnect 150 may be formed from copper or aluminum. For the reasons described above, an aluminum wirebond interconnect 150 may be preferred with an aluminum wirebond pad 151. In one embodiment, wirebond interconnect 151 may also be known as a bonding wire.

The other end of each wirebond interconnect 150 is coupled to a bond pad 152. Therefore, the number of bond pads 152 may be similar to wirebond interconnects 150. In one embodiment, there may be more than 300 bond pads 152. Bond pad 152 may be formed on the top surface of package substrate 140. As shown in the embodiment of FIG. 1, bond pads 152 are located near the edge of the top surface. Pitch distances between two adjacent bond pads 152 may be similar to wirebond pads 151 (e.g., 0.045 mm), in one embodiment. However, a person skilled in the art will recognize applicability of other pitch distances depending on the application and process technologies.

Package substrate 140 forms the base for integrated circuit package 100. I/O signals from bond pads 152 (located on the top surface of package substrate 140) may be routed to solder balls 141 (located on the bottom surface of package substrate 140). Package substrate 140 may be a multi-layered substrate. In one embodiment, package substrate 140 may have at least two layers.

An I/O signal transmitted out from integrated circuit die 110 may be transmitted through conductive traces 122, conductive via 123, wirebond pad 151, wirebond interconnect 150, bond pad 152 and into conductive pathway within package substrate 140 and out of solder ball 141 to an external integrated circuit package (external to integrated circuit package 100). In contrast, an I/O signal transmitted into integrated circuit die 110 may be transmitted through solder ball 141, conductive pathway within package substrate 140, bond pad 152, wirebond interconnect 150, wirebond pad 151, conductive via 123, conductive traces 122 and into integrated circuit die 110.

Hence, integrated circuit package 100, by using routing layer 120, may fan-out signal pathways from I/O terminals of integrated circuit die 110 to peripheral edges of routing layer 120. That way, integrated circuit package 100 may include integrated circuit die 110 that has small pitch signal pads.

Figure 2:
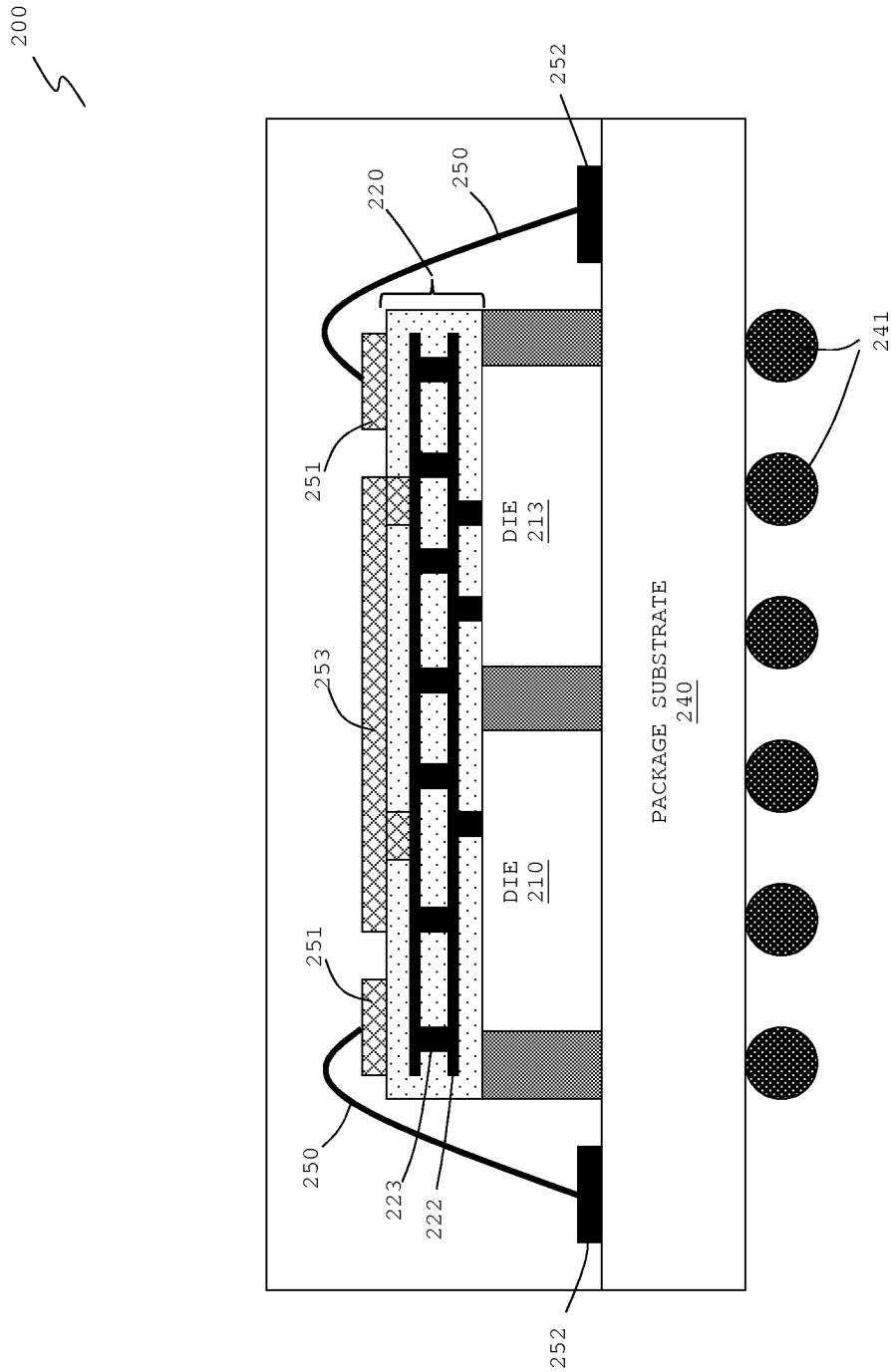
FIG. 2 shows an illustrative multi-chip integrated circuit package in accordance with one embodiment of the present invention.

FIG. 2, meant to be illustrative and not limiting, illustrates multi-chip integrated circuit package in accordance with one embodiment of the present invention. Integrated circuit package 200 may be known as a multi-chip integrated circuit package given that there is more than one integrated circuit die (i.e., integrated circuit die 210 and 213) within integrated circuit package 100. Even though two integrated circuit dies 210 and 213 are shown in FIG. 2, it should be appreciated that there may be more than two integrated circuits in a multi-chip package such as integrated circuit package 200. The integrated circuit package 200 may also be known as a system-on-package (SoP) device.

Integrated circuit package 200 may be similar to integrated circuit package 100 of FIG. 1 with the exception that integrated circuit package 200 may include two integrated circuit dies 210 and 213. Integrated circuit package 200 includes routing layer 220, conductive traces 253, wirebond pads 251, wirebond interconnects 250, bond pads 252, package substrate 240 and solder ball 241 that are similar to routing layer 120, conductive traces 153, wirebond pads 151, wirebond interconnects 150, bond pads 152, package substrate 140 and solder ball 141, respectively, of FIG. 1. Therefore, for the sake of brevity, the details of each of these components are not repeated.

Referring still to FIG. 2, integrated circuit package 200 is a ball-grid array (BGA) package. Solder balls 241 may be formed on package substrate 240. Solder balls 241 may be coupled to a printed circuit board (PCB) (not shown). In one embodiment, pitch distance between two adjacent solder balls 241 may be approximately 0.8 mm. However, a person skilled in the art will recognize applicability of other pitch distances between two adjacent solder balls 241 depending on the application and process technologies.

Integrated circuit dies 210 and 213 may each be different types of devices; for example, dies 210 and 213 may be an FPGA die and a memory die, respectively. Alternatively, integrated circuit dies 210 and 213 may each be similar types of devices; for example, both dies 210 and 213 may be FPGA integrated circuits. It should be appreciated that combining different types of integrated circuit dies 210 and 213 may yield different functions for integrated circuit package 200. Furthermore, integrated circuit dies may have identical physical dimensions (i.e., identical length, width and height). In another embodiment, integrated circuit dies may have different physical dimensions (i.e., different length and width) with an exception to the height. In one embodiment, integrated circuit dies may have all of their physical dimensions be different (i.e., different length, width and height). The difference in the height can be compensated by adding additional dielectric material (e.g., dielectric 111 or dielectric 121 of FIG. 1). In one exemplary embodiment, the length and width of integrated circuit dies 210 and 213 may be greater than 2 mm and the height to approximately 2 mm.

Integrated circuit dies 210 and 213 may communicate with each other through routing layer 220 (i.e., through signal traces 222 and conductive vias 223). In one embodiment, signal traces 222 and conductive vias 223 may be similar to conductive traces 122 and conductive vias 123, respectively, of FIG. 1. Signal traces 222 within routing layer 220 may be packed densely as it can be designed with small pitch distance (e.g., pitch distances of less than 0.045 mm). Hence, this resolves the issue of large number of intra-die congestion issue that exist for multi-die wirebond packages (which generally use signal traces within a package substrate).

Figure 3:
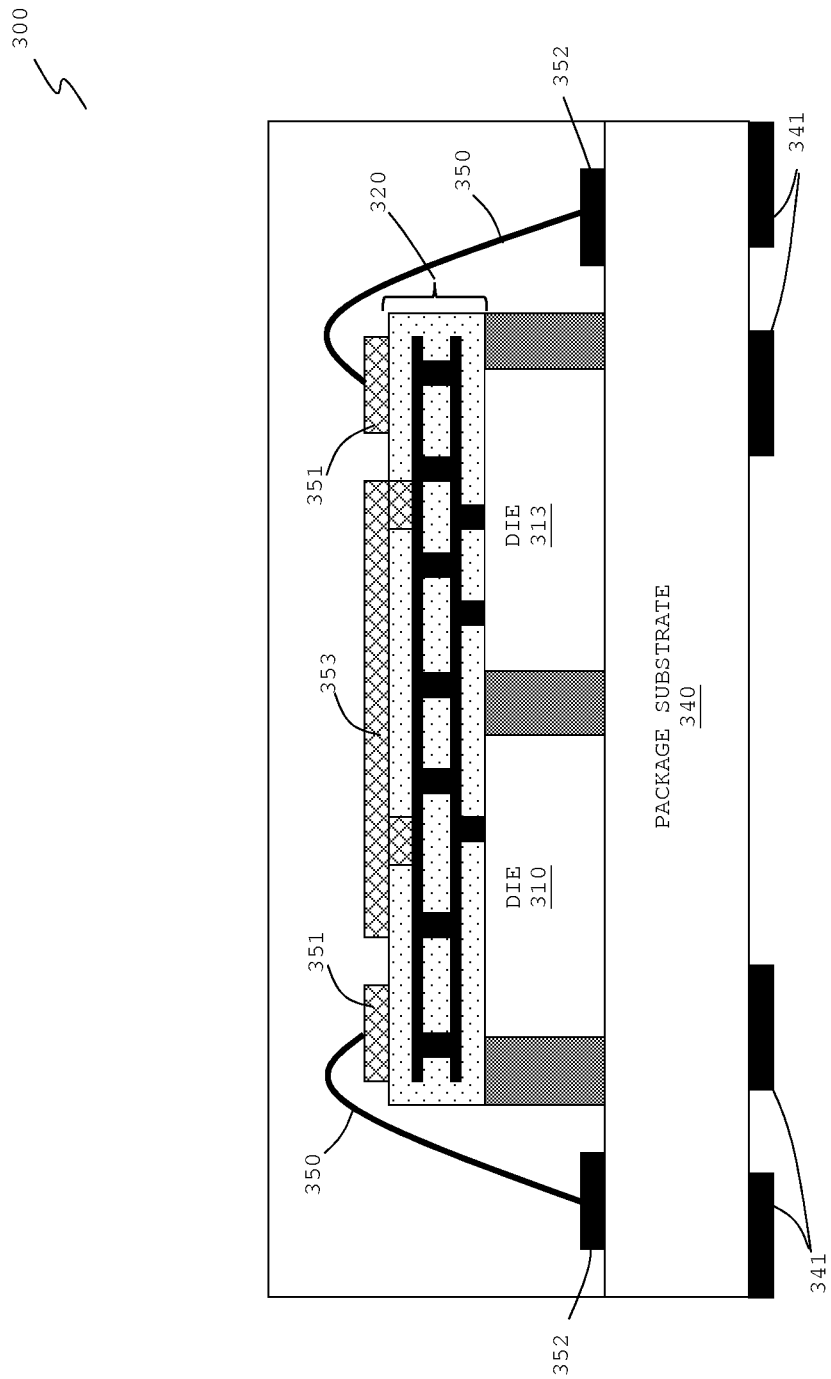
FIG. 3 shows an illustrative land-grid array (LGA) multi-chip integrated circuit package in accordance with one embodiment of the present invention.

FIG. 3, meant to be illustrative and not limiting, illustrates a land-grid array (LGA) multi-chip integrated circuit package in accordance with one embodiment of the present invention. Integrated circuit package 300 may be similar to integrated circuit package 200 of FIG. 2, with the exception on the type of package. Integrated circuit package 300 is an LGA package. As shown in the embodiment of FIG. 3, integrated circuit package 300 includes contacts 341 instead of solder balls 241 of FIG. 2. Similar to solder balls 241, contacts 341 are formed on package substrate 341. Contacts 341 may be coupled to pins on a socket formed on a printed circuit board.

Referring still to FIG. 3, integrated circuit package 300 may include one or more integrated circuit dies (e.g., dies 310 and 313), routing layer 320, conductive traces 353, wirebond pads 351, wirebond interconnects 350, bond pads 352, and package substrate 340 that are similar to integrated circuit dies 210 and 213, routing layer 220, conductive traces 253, wirebond pads 251, wirebond interconnects 250, bond pads 252, and package substrate 240, respectively, of FIG. 2. The integrated circuit dies 310 and 313 may be coupled to package substrate 340 through a die attach film.

Figure 4:
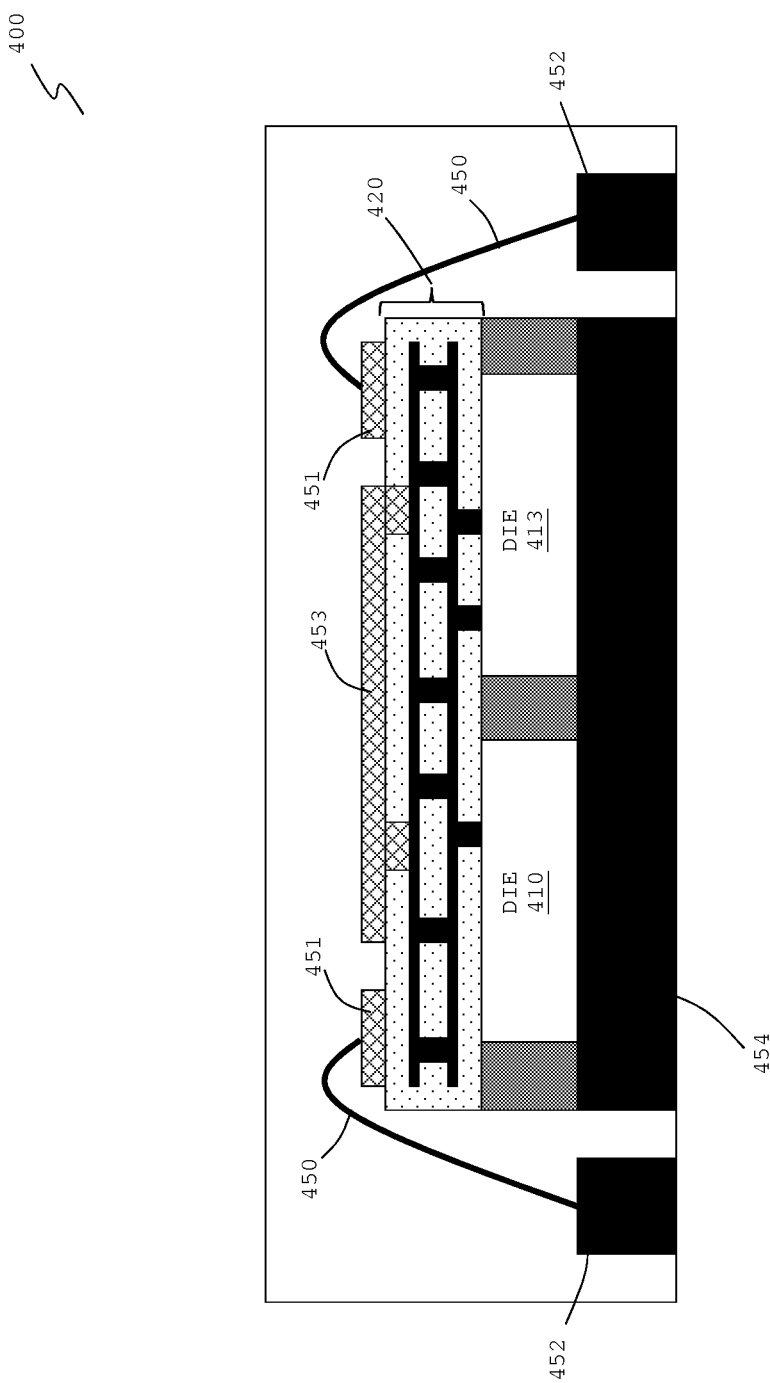
FIG. 4 shows an illustrative quad flat no-lead (QFN) multi-chip integrated circuit package in accordance with one embodiment of the present invention.

FIG. 4, meant to be illustrative and not limiting, illustrates a quad flat no-lead (QFN) multi-chip integrated circuit package in accordance with one embodiment of the present invention. Integrated circuit package 400 may be similar to integrated circuit package 200 of FIG. 2 or integrated circuit 300 of FIG. 3, with the exception of the type of package. Integrated circuit package 400 is a QFN package.

Referring still to FIG. 4, integrated circuit package 400 includes one or more integrated circuit dies, e.g., dies 410 and 413, routing layer 420, conductive traces 453, wirebond pads 451 and wirebond interconnects 450 that is similar to integrated circuit dies 210 and 213, routing layer 220, conductive traces 253, wirebond pads 251, and wirebond interconnects 250, respectively, of FIG. 2.

As shown in the embodiment of FIG. 4, integrated circuit package 400 includes lead frames 452 that is utilized to couple to external circuitry (external to integrated circuit package 400) instead of solder balls 241 of FIG. 2 and, contacts 341 of FIG. 3. Multiple lead frames 452 are formed on the edge of integrated circuit package 400 and is coupled to an end of wirebond interconnects 450. In addition to that, integrated circuit package 400 includes lead frame 454. As shown in the embodiment of FIG. 4, lead frame 454 may be utilized to mount integrated circuit die 410 and 413.

Figure 5:
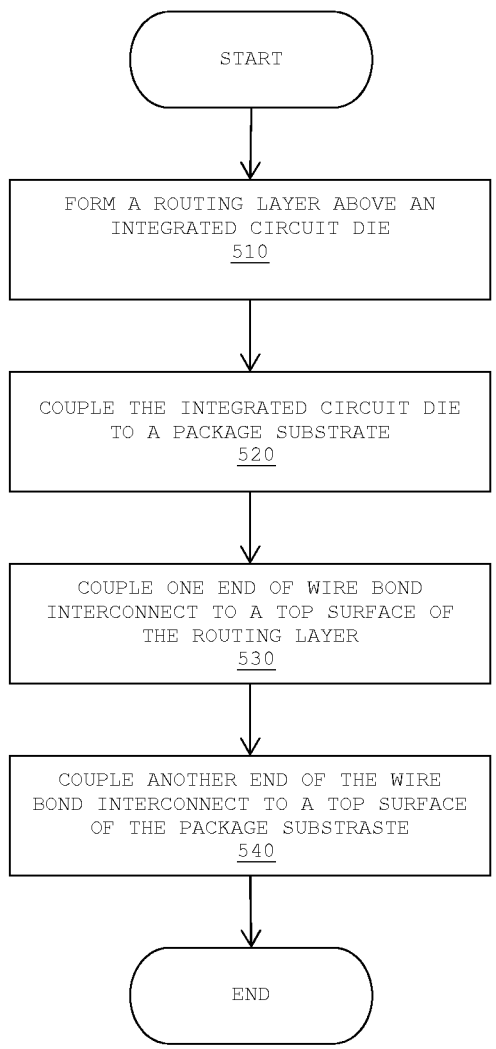
FIG. 5 shows a flowchart of illustrative steps for fabricating an integrated circuit package of the type shown in FIG. 1 in accordance with one embodiment of the present invention.

FIG. 5, meant to be illustrative and not limiting, illustrates a method of forming an integrated circuit package in accordance with one embodiment of the present invention. The integrated circuit package may be similar to integrated circuit package 100 of FIG. 1. At step 510, a routing layer may be formed on a top surface of an integrated circuit die. In one embodiment, the routing layer may be similar to routing layer 120 of FIG. 1 and the integrated circuit die may be similar to integrated circuit die 110 of FIG. 1. The routing layer may be a fan-out redistribution layer (RDL). The routing layer may include dielectric (e.g., dielectric 121 of FIG. 1) and conductive traces and conductive vias (conductive traces 122 and conductive vias 123 of FIG. 1). The top surface of the routing layer (a surface that is on the opposite end of the surface that is coupled to the integrated circuit die) may include wirebond pads (e.g., wirebond pads 151 of FIG. 1.)

At step 520, the integrated circuit die is coupled to a package substrate. In one embodiment, the package substrate may be similar to package substrate 140 of FIG. 1. The integrated circuit die may be coupled to top surface of the package substrate. In one embodiment, the package substrate may have width and length dimensions that are larger than the integrated circuit die and the routing layer. Package substrate may also include bond pads (e.g., bond pads 152 of FIG. 1).

At step 530, one end of the wirebond interconnect is coupled to bond pad on the top surface of the routing layer. In one embodiment, the wirebond interconnect may be similar to wirebond interconnect 150 of FIG. 1. The wirebond interconnects may be coupled to a bond pad using the three different types of wirebond interconnect techniques: (a) ball bonding, (b) wedge bonding and (c) compliant bonding. A person skilled in the art appreciates these different wirebond techniques and may utilize any one of the types of wirebond technique according to its advantages to the application.

At step 540, another end of the wirebond interconnect is coupled to another bond that is located on top of the package substrate. The bond pad referred herein may be similar to bond pad 152 of FIG. 1. At the completion of step 540, an integrated circuit package similar to integrated circuit package 100 of FIG. 1 may be formed.

Figure 6:
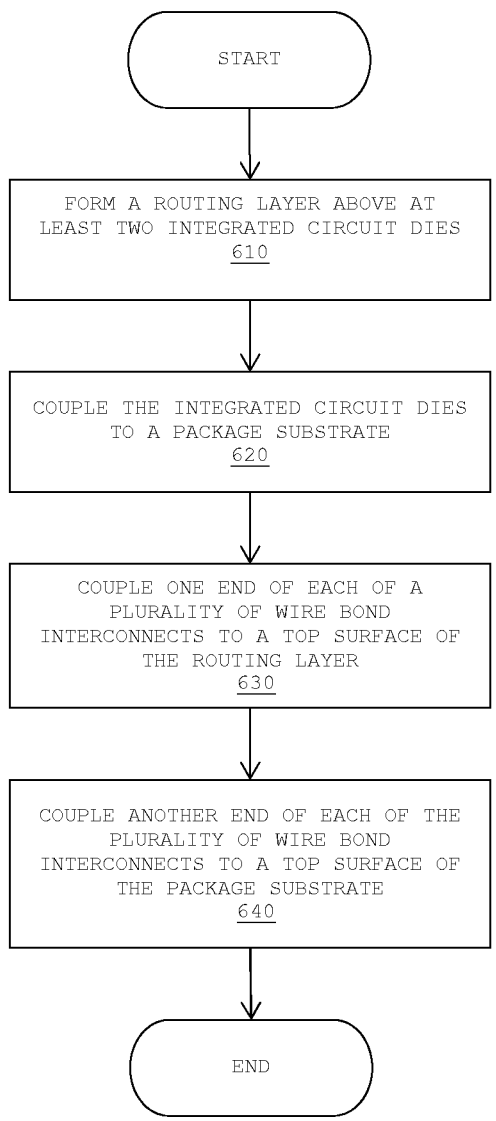
FIG. 6 shows a flowchart of illustrative steps for fabricating a multi-die integrated circuit package of the type shown in FIGS. 2-4 in accordance with one embodiment of the present invention.

FIG. 6, meant to be illustrative and not limiting, illustrates a method to form a multi-die integrated circuit package in accordance with one embodiment of the present invention. The multi-die integrated circuit package may be similar to integrated circuit package 200 of FIG. 2, integrated circuit package 300 of FIG. 3 or integrated circuit package 400 of FIG. 4 (with minor modification to steps in FIG. 6). The steps in FIG. 6 may be similar to the steps in FIG. 6, with the exception that multiple integrated circuit dies are formed rather than a single integrated circuit die. Therefore, at step 610, a routing layer may be formed above multiple integrated circuit dies rather than only one integrated circuit die. The routing layer may still be a fan-out redistribution layer (RDL) and the top surface of the routing layer (a surface that is on the opposite end of the surface that is coupled to the integrated circuit die) may include wirebond pads (e.g., wirebond pads 251 of FIG. 2, wirebond pads 351 of FIG. 3 or wirebond pads 452 of FIG. 4)

At step 620, which is similar to step 520, the multiple integrated circuit dies are mounted on to a package substrate. The package substrate may have width and length dimensions that are larger than the total combined width and length of these multiple integrated circuit dies. The package substrate may also have larger width and length than the routing layer. Package substrate may also include bond pads (e.g., bond pads 252 of FIG. 2 or bond pads 352 of FIG. 3). In order to form integrated circuit package 400 of FIG. 4, this step may be omitted.

At step 630, one end of the wirebond interconnect is coupled to bond pad on the top surface of the routing layer. In one embodiment, the wirebond interconnect may be similar to wirebond interconnect 250 of FIG. 2, wirebond interconnect 350 of FIG. 3 or wirebond interconnect 450 of FIG. 4. At step 640, another end of the wirebond interconnect is coupled to another bond pad that is located on top of the package substrate. As for forming an integrated circuit package similar to integrated circuit package 400 of FIG. 4, the other end of wirebond interconnect may be coupled to a lead frame (e.g., lead frames 452 of FIG. 4). At the completion of step 640, an integrated circuit package similar to integrated circuit package 200 of FIG. 2, integrated circuit package 300 of FIG. 3 or integrated circuit package 400 of FIG. 4 may be formed.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit package, comprising:
a package substrate having a top surface;
a first integrated circuit die that is mounted on the top surface of the package substrate;
a second integrated circuit die that is mounted on the top surface of the package substrate, wherein the first and second integrated circuit dies are laterally adjacent;
a redistribution layer that is formed on a surface of the first integrated circuit die and a surface of the second integrated circuit die, wherein the redistribution layer is wider than the first integrated circuit die and the second integrated circuit die;
a wirebond interconnect having an end that is coupled to the redistribution layer;
a first wirebond pad that is formed on the redistribution layer and that is coupled to the wirebond interconnect; and
a second wirebond pad that is formed on the top surface of the package substrate, wherein the second wirebond pad and the first and second integrated circuit dies are mounted on the same plane at the top surface of the package substrate, and wherein the wirebond interconnect has another end that is coupled to the second wirebond pad.

2. The integrated circuit package as defined in claim 1, wherein the redistribution layer conveys signals between the first integrated circuit die and the first wirebond pad.

3. The integrated circuit package as defined in claim 2, wherein the package substrate is selected from a group of package types consisting of: grid array packages and lead frame packages.

4. The integrated circuit package as defined in claim 1, wherein the redistribution layer includes multiple layers of conductive routing traces and conductive vias formed in dielectric material.

5. The integrated circuit package as defined in claim 4, wherein the dielectric material is formed from a material selected from a group of materials consisting of: polyimide, polybenzoxazoles, and benzocyclobuten.

6. An integrated circuit package, comprising:
first and second laterally adjacent integrated circuit dies;
a routing layer formed on the first integrated circuit die and on the second integrated circuit die, wherein the first integrated circuit die communicates with the second integrated circuit die through the routing layer, wherein the routing layer includes a first conductive routing trace, a second conductive routing trace, and a conductive via interposed between the first and second conductive routing traces, and wherein the first and second conductive routing traces are separated by dielectric material; and
a bonding wire having an end that is coupled to the routing layer.

7. The integrated circuit package as defined in claim 6, further comprising:
a package substrate on which the first and second integrated circuit dies are mounted, wherein the bonding wire has another end that is coupled to the package substrate.

8. The integrated circuit package as defined in claim 7, further comprising:
a plurality of bond pads formed on a top surface of the package substrate, wherein the first and second integrated circuit dies are mounted on a top surface of the package substrate, and wherein the bonding wire is coupled to one of the plurality of bond pads.

9. The integrated circuit package as defined in claim 8, wherein the plurality of bond pads is selected from a group of bond pads consisting of: ball grid array (BGA) interconnects, a land grid array (LGA) interconnects, and quad flat no-leads (QFN) interconnects.

10. The integrated circuit package as defined in claim 6, wherein the first and second integrated circuit dies are different.

11. The integrated circuit package as defined in claim 6, wherein the package substrate is larger in size than the first and second integrated circuit dies and is larger than the routing layer.

12. The integrated circuit package as defined in claim 6, wherein the routing layer conveys signals between the first and second integrated circuit dies.

13. A method of forming an integrated circuit package, comprising:
forming an integrated circuit die having a dielectric stack;
forming a routing layer on the integrated circuit die, wherein the routing layer includes alternating conductive routing layers and conductive via layers separated by dielectric material, and wherein the routing layer is separate from the dielectric stack;
forming a wirebond pad over the routing layer;
mounting the integrated circuit die on a package substrate; and
attaching one end of a wirebond interconnect to the wirebond pad.

14. The method as defined in claim 13, further comprising:
attaching another end of the wirebond interconnect to the package substrate.

15. The method as defined in claim 14, further comprising:
forming another integrated circuit die that is interposed between the routing layer and the package substrate, wherein the integrated circuit die and the another integrated circuit die are laterally adjacent and communicate via the routing layer.

16. The method as defined in claim 15, further comprising:
attaching one end of another wirebond interconnect to another wirebond pad on the top surface of the routing layer.

17. The method as defined in claim 14, wherein the integrated circuit package is a type of package selected from a group of packages consisting of: grid array packages and lead frame packages.

* * * * *